United States Patent
Ishikawa et al.

(10) Patent No.: US 10,854,385 B2
(45) Date of Patent: Dec. 1, 2020

(54) METHOD FOR PRODUCING CERAMIC SUBSTRATE, CERAMIC SUBSTRATE, AND MODULE

(71) Applicant: Murata Manufacturing Co., Ltd., Kyoto (JP)

(72) Inventors: Kumiko Ishikawa, Kyoto (JP); Seiji Fujita, Kyoto (JP); Tsutomu Sasaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/821,232

(22) Filed: Mar. 17, 2020

(65) Prior Publication Data

US 2020/0219652 A1    Jul. 9, 2020

Related U.S. Application Data

(63) Continuation of application No. PCT/JP2018/033380, filed on Sep. 10, 2018.

(30) Foreign Application Priority Data

Sep. 20, 2017  (JP) ................................ 2017-180249
Feb. 13, 2018  (JP) ................................ 2018-023074

(51) Int. Cl.
*H01G 4/12*    (2006.01)
*H01G 4/30*    (2006.01)
*H01G 4/10*    (2006.01)

(52) U.S. Cl.
CPC .............. *H01G 4/12* (2013.01); *H01G 4/30* (2013.01); *H01G 4/10* (2013.01)

(58) Field of Classification Search
CPC .. H01G 4/12; H01G 4/30; H01G 4/10; H05K 3/40; H05K 3/46
(Continued)

(56) References Cited

U.S. PATENT DOCUMENTS 3,772,748 A * 11/1973 Rutt .................... H01L 23/5383
                                                          29/25.42
5,725,938 A *  3/1998 Jin ........................ C04B 41/009
                                                          428/210
(Continued)

FOREIGN PATENT DOCUMENTS

JP        H0864029 A    3/1996
JP        H0888470 A    4/1996
(Continued)

OTHER PUBLICATIONS

International Search Report issued in Application No. PCT/JP2018/033380, dated Dec. 4, 2018.
(Continued)

*Primary Examiner* — Sherman Ng
(74) *Attorney, Agent, or Firm* — Pearne & Gordon LLP

(57) ABSTRACT

A method for producing a ceramic substrate that includes a substrate body having ceramic layers and columnar projecting electrodes on a first primary surface of the substrate body. The method includes a step of preparing electrode formation sheets for forming the projecting electrodes, a step of perforating the electrode formation sheets with through holes and filling the through holes with a first electrically conductive paste containing a first electrically conductive powder, a step of building a composite multilayer body by stacking ceramic green sheets and the electrode formation sheets on a first primary surface of the stack of ceramic green sheets. The first electrically conductive powder contains electrically conductive metal(s) and anti-sintering ceramic(s) that controls the sintering of particles of the electrically conductive metal(s), with at least part of the surface of the particles of the electrically conductive metal(s) covered with the anti-sintering ceramic(s).

20 Claims, 8 Drawing Sheets

(58) Field of Classification Search
USPC .......................................................... 174/250
See application file for complete search history.

(56) References Cited

U.S. PATENT DOCUMENTS

| | | | | |
|---|---|---|---|---|
| 6,300,576 | B1* | 10/2001 | Nakamura | H01L 21/4853 |
| | | | | 174/261 |
| 2005/0151303 | A1 | 7/2005 | Konishi et al. | |
| 2006/0231397 | A1* | 10/2006 | Nakagaki | G01N 27/4075 |
| | | | | 204/431 |
| 2007/0278670 | A1 | 12/2007 | Kimura et al. | |
| 2011/0222209 | A1* | 9/2011 | Ohyama | H01G 9/0525 |
| | | | | 361/523 |
| 2014/0327993 | A1* | 11/2014 | Sumi | H02H 9/04 |
| | | | | 361/56 |
| 2016/0044769 | A1 | 2/2016 | Adachi et al. | |
| 2016/0073499 | A1 | 3/2016 | Ogawa et al. | |
| 2019/0295911 | A1* | 9/2019 | Fujita | H01L 23/49822 |

FOREIGN PATENT DOCUMENTS

| | | |
|---|---|---|
| JP | 2002343904 A | 11/2002 |
| JP | 2005197663 A | 7/2005 |
| JP | 2007123448 A | 5/2007 |
| JP | 4038611 B2 | 1/2008 |
| JP | 201249187 A | 3/2012 |
| JP | 5527048 B2 | 6/2014 |
| JP | 6086151 B2 | 3/2017 |
| WO | 2007049458 A1 | 5/2007 |
| WO | 2014188760 A | 11/2014 |

OTHER PUBLICATIONS

Written Opinion issued in Application No. PCT/JP2018/033380, dated Dec. 4, 2018.

* cited by examiner

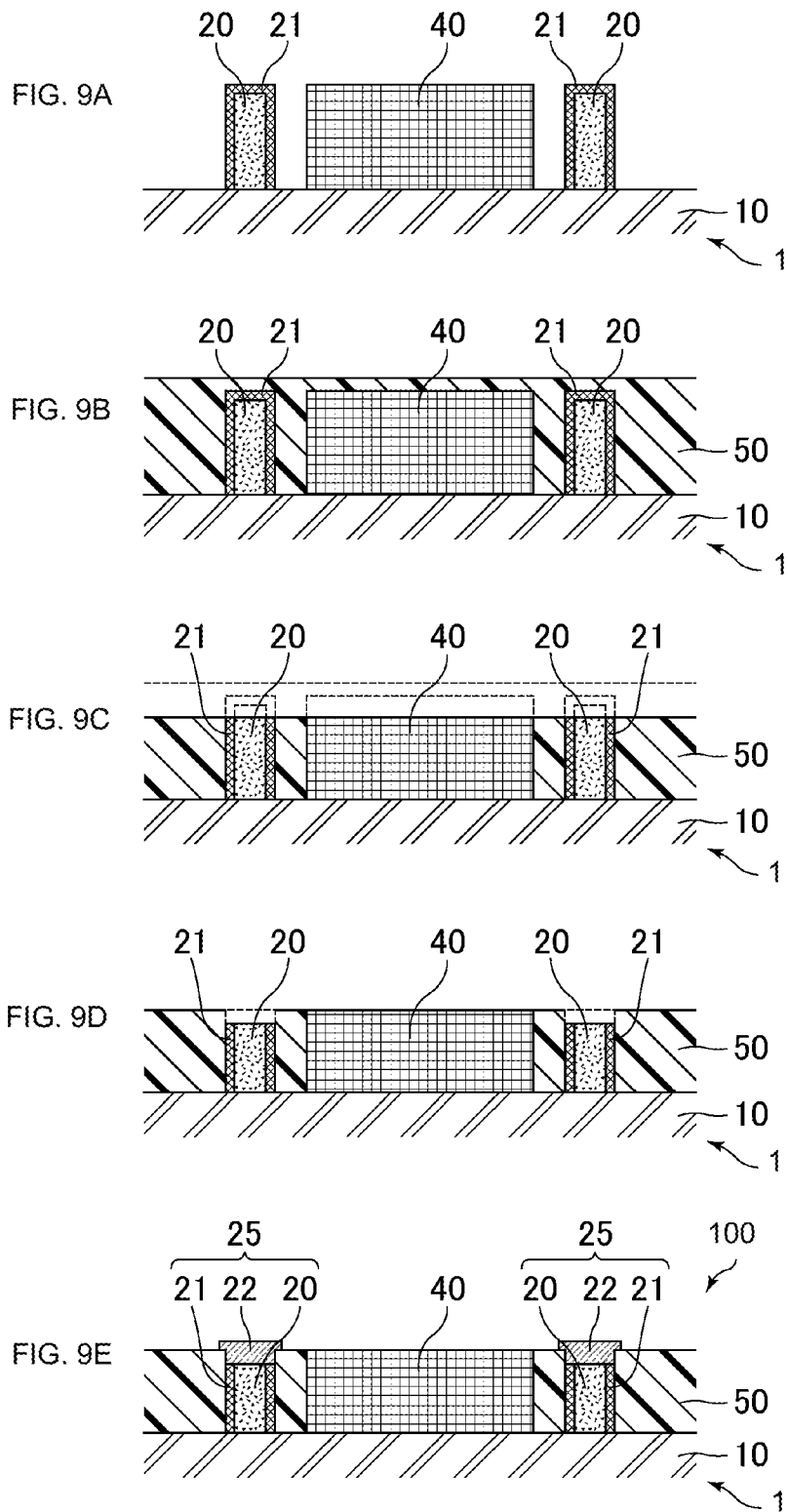

METHOD FOR PRODUCING CERAMIC SUBSTRATE, CERAMIC SUBSTRATE, AND MODULE

This is a continuation of International Application No. PCT/JP2018/033380 filed on Sep. 10, 2018 which claims priority from Japanese Patent Application No. 2017-180249 filed on Sep. 20, 2017, and claims priority from Japanese Patent Application No. 2018-023074 filed on Feb. 13, 2018. The contents of these applications are incorporated herein by reference in their entireties.

BACKGROUND

Technical Field

The present disclosure relates to a method for producing a ceramic substrate, a ceramic substrate, and a module.

A module known in the related art includes a substrate, such as a ceramic substrate, a resin layer on one primary surface of the substrate, an electronic component mounted on the primary surface of the substrate, and terminals for external connection with their end exposed on the surface of the resin layer.

A terminal for external connection includes a projecting electrode shaped like a pillar. The projecting electrode can be, for example, a metal pin made of an electrically conductive metal or sintered particles of an electrically conductive metal.

As a technology that replaces projecting electrodes in forming terminal electrodes of a multilayer ceramic capacitor or similar electronic component, Patent Document 1 discloses a paste for terminal electrodes as a dispersion of a low-resistance metal, a glass component, etc., with at least one of zirconia, magnesia, and alumina added thereto. According to Patent Document 1, inorganic materials like zirconia, magnesia, and alumina do not react well with low-resistance metals and therefore help prevent violent sintering of low-resistance metals. The paste therefore gives dense terminal electrodes by virtue of reduced contraction upon sintering.

Patent Document 1: Japanese Unexamined Patent Application Publication No. 8-64029

BRIEF SUMMARY

If one tries to form projecting electrodes using the paste for terminal electrodes described in Patent Document 1, it is inevitable to add more of alumina or other such material to control the contraction upon sintering because the projecting electrodes need to be formed to a pillar shape, or to have a certain height, unlike terminal electrodes. However, the more alumina or other such material is added, the higher the specific resistance of the projecting electrodes will be. Reducing the amount of alumina or other such material to lower the specific resistance of the projecting electrodes, however, will cause the contraction upon sintering not to be fully controlled, resulting in structural defects, such as cracks, in the projecting electrodes.

Made to solve the above problem, the present disclosure is intended to provide a method for producing a ceramic substrate free from cracks and other structural defects and having projecting electrodes of low specific resistance, and also to provide such a ceramic substrate. A module including this ceramic substrate is also provided.

A method according to the present disclosure for producing a ceramic substrate is a method for producing a ceramic substrate that includes a substrate body having ceramic layers and columnar projecting electrodes on a first primary surface of the substrate body. The method includes a step of preparing ceramic green sheets as a precursor of the ceramic layers, a step of preparing electrode formation sheets for forming the projecting electrodes, a step of perforating the electrode formation sheets with through holes and filling the through holes with a first electrically conductive paste containing a first electrically conductive powder, a step of building a composite multilayer body by stacking the ceramic green sheets and stacking the electrode formation sheets with the through holes therein filled with the first electrically conductive paste on a first primary surface of the stack of ceramic green sheets, and a step of firing the composite multilayer body at a temperature at which the ceramic green sheets sinter. The first electrically conductive powder contains at least one electrically conductive metal and at least one anti-sintering ceramic that controls the sintering of particles of the electrically conductive metal, with at least part of the surface of the particles of the electrically conductive metal covered with the anti-sintering ceramic.

In an embodiment of the method according to the present disclosure for producing a ceramic substrate, the electrode formation sheets are constraining sheets that undergo no sintering at the temperatures at which the ceramic green sheets sinter. In this case, the composite multilayer body is fired at a temperature at which the ceramic green sheets sinter and the constraining sheets do not, and then the leftover constraining sheets are removed.

In an embodiment of the method according to the present disclosure for producing a ceramic substrate, the electrode formation sheets are resin sheets that burn away at or below the temperatures at which the ceramic green sheets sinter. In this case, the resin sheets are burnt away in the step of firing the composite multilayer body.

In the method according to the present disclosure for producing a ceramic substrate, the anti-sintering ceramic can include at least one selected from the group consisting of alumina, zirconia, and silica.

In the method according to the present disclosure for producing a ceramic substrate, the electrically conductive metal can include at least one selected from the group consisting of copper, silver, and nickel.

In the method according to the present disclosure for producing a ceramic substrate, the amount of the anti-sintering ceramic in the first electrically conductive paste can be 10% by weight or less of the total weight of the electrically conductive metal and the anti-sintering ceramic. The amount of the anti-sintering ceramic in the first electrically conductive paste can be 0.3% by weight or more of the total weight of the electrically conductive metal and the anti-sintering ceramic.

The method according to the present disclosure for producing a ceramic substrate can further include, after the step of filling the through holes with the first electrically conductive paste, a step of applying a second electrically conductive paste containing a second electrically conductive powder to the surface of the through holes. The second electrically conductive powder contains the electrically conductive metal and the anti-sintering ceramic, with at least part of the surface of particles of the electrically conductive metal covered with the anti-sintering ceramic. In the step of building the composite multilayer body in this case, the electrode formation sheet with the second electrically conductive paste applied to the surface of the through holes is placed atop.

In the step of building the composite multilayer body, the electrode formation sheet with the second electrically conductive paste applied to the surface of the through holes can be placed inside, too.

The amount of the anti-sintering ceramic in the second electrically conductive paste can be 10% by weight or less of the total weight of the electrically conductive metal and the anti-sintering ceramic. The amount of the anti-sintering ceramic in the second electrically conductive paste can be 0.5% by weight or more of the total weight of the electrically conductive metal and the anti-sintering ceramic.

A ceramic substrate according to the present disclosure is a ceramic substrate that includes a substrate body having ceramic layers and columnar projecting electrodes on a first primary surface of the substrate body. The first primary surface of the substrate body has a region for the mounting of an electronic component in the area not occupied by the projecting electrodes. The projecting electrodes contain at least one electrically conductive metal and at least one anti-sintering ceramic that controls the sintering of particles of the electrically conductive metal, and have a porous structure resulting from necking between the particles of the electrically conductive metal.

For the ceramic substrate according to the present disclosure, the anti-sintering ceramic can include at least one selected from the group consisting of alumina, zirconia, and silica.

For the ceramic substrate according to the present disclosure, the electrically conductive metal can include at least one selected from the group consisting of copper, silver, and nickel.

For the ceramic substrate according to the present disclosure, the amount of the anti-sintering ceramic in the projecting electrodes can be 10% by weight or less of the total weight of the electrically conductive metal and the anti-sintering ceramic. The amount of the anti-sintering ceramic in the projecting electrodes can be 0.3% by weight or more of the total weight of the electrically conductive metal and the anti-sintering ceramic.

For the ceramic substrate according to the present disclosure, it may be that at least part of the surface of the particles of the electrically conductive metal is covered with the anti-sintering ceramic.

For the ceramic substrate according to the present disclosure, the projecting electrodes can have a dense layer, a layer having a lower porosity than the remaining portion of the electrodes, atop thereof.

The projecting electrodes can have the dense layer inside, too.

The dense layer or layers of the projecting electrodes can be wider than the portion excluding the dense layer or layers.

A module according to the present disclosure includes a ceramic substrate according to the present disclosure, an electronic component mounted on the first primary surface of the substrate body as a component of the ceramic substrate, and a resin layer on the first primary surface of the substrate body. The electronic component is positioned in the resin layer to be mounted in the area of the first primary surface of the substrate body not occupied by the projecting electrodes. On the first primary surface of the substrate body are terminals for external connection including the projecting electrodes. The terminals for external connection are positioned in the resin layer to have the end thereof exposed on the surface of the resin layer.

In the module according to the present disclosure, at least part of the surface of the electronic component can be exposed on the surface of the resin layer.

In the module according to the present disclosure, the terminals for external connection can further include plating that covers at least part of the side of the projecting electrodes. The terminals for external connection can further include a coating that covers at least part of the top of the projecting electrodes.

The present disclosure provides a ceramic substrate free from cracks and other structural defects and having projecting electrodes of low specific resistance.

BRIEF DESCRIPTION OF THE SEVERAL VIEWS OF THE DRAWINGS

FIGS. 9A, 9B, 9C, 9D, and 9E are cross-sectional diagrams schematically illustrating an example of a method for producing the module illustrated in FIG. 8A.

DETAILED DESCRIPTION

The following describes a method according to the present disclosure for producing a ceramic substrate, a ceramic substrate according to the present disclosure, and a module according to the present disclosure.

The present disclosure, however, is not limited to the following configurations and can be applied with any necessary modifications within the scope of the present disclosure. Combinations of two or more separate desirable configurations of the present disclosure set forth below are also aspects of the present disclosure.

[Ceramic Substrate]

First, a ceramic substrate according to the present disclosure is described.

Figure 1:
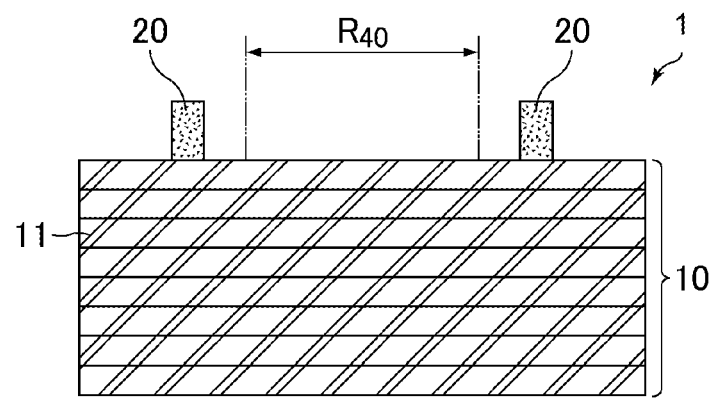
FIG. 1 is a schematic cross-section of an example of a ceramic substrate according to the present disclosure.

FIG. 1 is a schematic cross-section of an example of a ceramic substrate according to the present disclosure.

The ceramic substrate 1 illustrated in FIG. 1 includes a substrate body 10 and columnar projecting electrodes 20 on a first primary surface of the substrate body 10. As a component of the ceramic substrate 1 illustrated in FIG. 1, the substrate body 10 has a stack of multiple ceramic layers 11.

The projecting electrodes 20 are electrically coupled to wiring conductors (not illustrated) in or on the substrate body 10. Although not illustrated in FIG. 1, the substrate body 10 has wiring conductors such as inner conductors, which are between the ceramic layers 11; outer conductors, which are on the first and second primary surfaces of the substrate body 10; and via conductors, which extend through the ceramic layers 11 in the direction of thickness, and a particular set of wiring conductors are electrically coupled to the projecting electrodes 20. For example, the projecting electrodes 20 may be coupled to outer conductors lying on the surface of the ceramic layers 11 or may be coupled to via conductors exposed on the surface of the ceramic layers 11.

The ceramic substrate 1 illustrated in FIG. 1 can be used to produce the module 100 illustrated in FIG. 8A (described later herein). The first primary surface of the substrate body 10 therefore has a region $R_{40}$ for the mounting of an electronic component in the area not occupied by the projecting electrodes 20.

As a component of the ceramic substrate according to the present disclosure, the ceramic layers forming the substrate body can contain a low-temperature-sintering ceramic material. The term low-temperature-sintering ceramic material refers to a ceramic material that can be sintered by firing at or below 1000° C. and can be fired simultaneously with copper, silver, etc.

Examples of low-temperature-sintering ceramic materials that can be contained in the ceramic layers include glass-ceramic composite low-temperature-sintering materials, which are mixtures of a ceramic material, such as quartz, alumina, or forsterite, and borosilicate glass; crystallized-glass low-temperature-sintering ceramic materials, which are made with $ZnO$—$MgO$—$Al_2O_3$—$SiO_2$ crystallized glass; and non-vitreous low-temperature-sintering ceramic materials, which are made with, for example, a $BaO$—$Al_2O_3$—$SiO_2$ ceramic material or $Al_2O_3$—$CaO$—$SiO_2$—$MgO$—$B_2O_3$ ceramic material.

As a component of the ceramic substrate according to the present disclosure, the projecting electrodes will function as terminals for external connection in a module made with the ceramic substrate.

A feature of the ceramic substrate according to the present disclosure is that the projecting electrodes as its component contain at least one electrically conductive metal and at least one anti-sintering ceramic that controls the sintering of the electrically conductive metal. Besides this, the projecting electrodes have a porous structure resulting from necking between particles of the electrically conductive metal.

As mentioned herein, the term porous structure refers to a structure that has many pores. The pores should be distinguished from voids, such as cracks.

High porosity of the projecting electrodes tends to affect the physical strength of the projecting electrodes themselves. The porosity of the projecting electrodes can be 50% or less.

Figure 2:
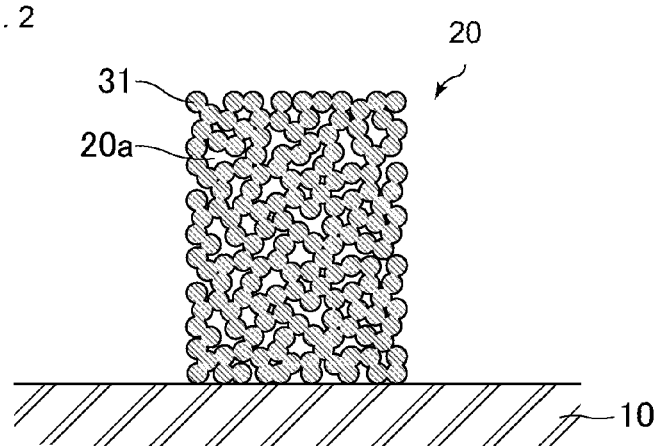
FIG. 2 is a schematic cross-section of an example of a projecting electrode.

FIG. 2 is a schematic cross-section of an example of a projecting electrode.

As illustrated in FIG. 2, a projecting electrode 20, lying on the first primary surface of the substrate body 10, has a porous structure, a structure having many pores 20a. Specifically, there are porous segments (pores 20a) between boundaries in necked electrically conductive metal 31. The anti-sintering ceramic is not illustrated in FIG. 2.

As a component of the ceramic substrate according to the present disclosure, the entire projecting electrodes have a porous structure as illustrated in FIG. 2.

The statement "the entire projecting electrodes have a porous structure" means that when a cross-section of the projecting electrodes observed as in FIG. 2 is divided into three equal parts by lines parallel to the surface of the substrate body, and porosity is determined in each of the three regions, the porosity is substantially equal across the three regions (the ratio between the largest and the smallest can be 2 or less). If the projecting electrodes have dense layer(s), the porosity is determined in the portion excluding the dense layer(s). If the porosity measurements in three divided regions of this portion meet the above relationship, the above statement is satisfied.

The porosity of a projecting electrode can be determined as follows.

The projecting electrode is impregnated with a fluorescent solution, and the fluorescent solution is cured. Then a cross-section of the projecting electrode is observed under a fluorescence microscope. The ratio between the area of the portion impregnated with the fluorescent solution (empty portion) and the portion not impregnated with the fluorescent solution (solid portion) is the porosity.

In producing a module by a method as illustrated in FIGS. 9A-9E (described later herein), reflow plating may leave part of the plating solution inside the projecting electrodes. In such a case, the solder can burst as a result of the pressure caused by a gas of the plating solution, produced during the reflow plating, going out of the projecting electrodes into the plating layer.

If the entire projecting electrodes have a porous structure, however, this defect of solder bursting is less frequent because the pressure is reduced compared with that with projecting electrodes having a non-porous structure or having a porous structure but only partially.

As a component of the ceramic substrate according to the present disclosure, the projecting electrodes can be formed using a first electrically conductive paste containing a first electrically conductive powder composed of particles of the electrically conductive metal and the anti-sintering ceramic covering the surface thereof. As detailed below, this ensures the particles of the electrically conductive metal will undergo necking with limited contraction while sintering. Having a structure that is porous but strong enough to maintain its shape, the resulting projecting electrodes will be free from cracks and other structural defects.

As a component of the ceramic substrate according to the present disclosure, the projecting electrodes can be formed by simultaneous firing with the substrate body. For example, the projecting electrodes can be formed through the process detailed later herein, i.e., by stacking electrode formation sheets having through holes filled with a first electrically conductive paste on a primary surface of a stack of ceramic green sheets, firing the resulting composite multilayer body, and then removing the electrode formation sheets.

In this case, the projecting electrodes can be formed in any desired shape by adjusting the size and pitch of the through holes in perforating the electrode formation sheets.

The electrically conductive metal contained in the projecting electrodes can be any such metal(s), but examples include metals such as copper, silver, nickel, palladium, and their alloys. The electrically conductive metal can include at least one selected from the group consisting of copper, silver, and nickel, or can include one selected from the group consisting of copper, silver, and nickel. The electrically conductive metal can be one selected from the group consisting of copper, silver, and nickel.

The anti-sintering ceramic contained in the projecting electrodes can be any ceramic(s) capable of controlling the sintering of particles of the electrically conductive metal, but examples include metal oxides, such as alumina, zirconia, and silica. The anti-sintering ceramic can include at least one selected from the group consisting of alumina, zirconia, and silica, or can include one selected from the group consisting of alumina, zirconia, and silica. The anti-sintering ceramic can be one selected from the group consisting of alumina, zirconia, and silica.

The amount of the anti-sintering ceramic in the projecting electrodes to ensure low specific resistance of the projecting electrodes can be 10% by weight or less of the total weight of the electrically conductive metal and the anti-sintering ceramic. To ensure that the projecting electrodes will be free from structural defects, it can be 0.3% by weight or more of the total weight of the electrically conductive metal and the anti-sintering ceramic.

The presence of electrically conductive metal(s) and anti-sintering ceramic(s) in the projecting electrodes can be confirmed by elemental analysis of the projecting electrodes. For example, if the projecting electrodes contain copper as an electrically conductive metal and alumina as anti-sintering ceramic, elemental analysis will detect the elements Cu, Al, and O.

In the projecting electrodes as a component of the ceramic substrate according to the present disclosure, part of the surface of the particles of the electrically conductive metal may be covered with the anti-sintering ceramic or may not be covered with the anti-sintering ceramic.

As a component of the ceramic substrate according to the present disclosure, the projecting electrodes may contain ingredients other than the electrically conductive metal and the anti-sintering ceramic. However, to prevent the projecting electrodes from being dense, substantially no glass component can be contained.

As a component of the ceramic substrate according to the present disclosure, the projecting electrodes may have any height. If the ceramic substrate is produced by a production method according to the present disclosure, however, the projecting electrodes can be formed to a height of at least approximately 200 µm.

As a component of the ceramic substrate according to the present disclosure, the projecting electrodes can have a dense layer, a layer having a lower porosity than the remaining portion of the electrodes, atop thereof. The projecting electrodes can have the dense layer inside, too.

In forming the projecting electrodes by the method detailed later herein, the surface of the projecting electrodes is exposed to physical impact when the constraining sheets are removed. A dense layer atop of and/or inside the projecting electrodes will therefore help reduce cracks, for example, in the projecting electrodes.

As a component of the ceramic substrate according to the present disclosure, dense layer(s) of the projecting electrodes may have the same width as the portion excluding the dense layer(s) or may be narrower than the portion excluding the dense layer(s). The dense layer(s) can be wider than the portion excluding the dense layer(s).

[Method for Producing a Ceramic Substrate]

The ceramic substrate according to the present disclosure can be produced as follows. A method for producing a ceramic substrate as described below is also an aspect of the present disclosure.

First, ceramic green sheets are prepared as a precursor of the ceramic layers as a component of the substrate body.

The ceramic green sheets are sheets, for example shaped by doctor blading, of an unsintered ceramic material that is a glass ceramic as a mixture of alumina and borosilicate glass or a ceramic slurry that contains an organic binder, a solvent, and powders as raw materials for a Ba—Al—Si—O ceramic, which will produce a glass component during firing. The ceramic slurry may contain additives, such as a dispersant and a plasticizer.

Paste film as a precursor of inner conductors or outer conductors and paste bodies as a precursor of via conductors are formed as necessary. The paste film is formed on a selected set of ceramic green sheets by, for example, screen printing using paste for wiring conductors that contains silver or copper. The paste bodies are formed by perforating another selected set of ceramic green sheets with through holes, for example using a laser or punch press, and then filling the through holes with a paste as described above.

Separately, electrode formation sheets for forming the projecting electrodes are prepared. The details of the electrode formation sheets will be discussed later herein.

The electrode formation sheets are perforated with through holes, and the through holes are filled with a first electrically conductive paste containing a first electrically conductive powder. As a result of this, paste bodies are formed as a precursor of the projecting electrodes. The perforation with through holes can be done using, for example, a laser or punch press. The first electrically conductive paste can contain a solvent, an organic binder, etc.

After the filling of the through holes in the electrode formation sheets with the first electrically conductive paste, a second electrically conductive paste containing a second electrically conductive powder can be applied to the surface of the through holes. As a result of this, paste film is formed as a precursor of dense layer(s) atop of and/or inside the projecting electrodes. The second electrically conductive paste can contain a solvent, an organic binder, etc.

Then the ceramic green sheets are stacked, and the electrode formation sheets with the through holes therein filled with the first electrically conductive paste are stacked on a first primary surface of the stack of ceramic green sheets to build a composite multilayer body. The sheets are stacked in such a manner that the projecting electrodes after firing will be electrically coupled to a selected set of wiring conductors in or on the substrate body.

If a second electrically conductive paste is applied to the surface of the through holes, the electrode formation sheet with the second electrically conductive paste applied to the surface of the through holes can be placed atop. This electrode formation sheet can be placed inside, too.

The ceramic green sheets and the electrode formation sheets can be stacked in any order. For example, the electrode formation sheets may be stacked on a stack of ceramic green sheets that has been prepared beforehand, or the electrode formation sheets and the ceramic green sheets may be stacked one by one.

Then the composite multilayer body is fired at a temperature at which the ceramic green sheets sinter. The electrode formation sheets are removed after the firing of the multilayer composite body or during the step of firing the composite multilayer body or in both steps, giving a ceramic substrate having projecting electrodes.

In the method according to the present disclosure for producing a ceramic substrate, the first electrically conductive powder, contained in the first electrically conductive paste, which is for forming the projecting electrodes, contains at least one electrically conductive metal and at least one anti-sintering ceramic that controls the sintering of particles of the electrically conductive metal, with at least part of the surface of the particles of the electrically conductive metal covered with the anti-sintering ceramic.

In the method according to the present disclosure for a ceramic substrate, projecting electrodes that contain at least one electrically conductive metal and at least one anti-sintering ceramic that controls the sintering of the electrically conductive metal are formed with a porous structure resulting from necking between particles of the electrically conductive metal. The entire projecting electrodes have a porous structure.

Figure 3A:
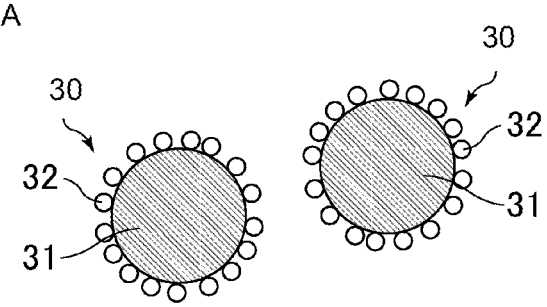
FIGS. 3A and 3B are schematic diagrams explaining the sintering of particles of an electrically conductive metal.
Figure 3B:
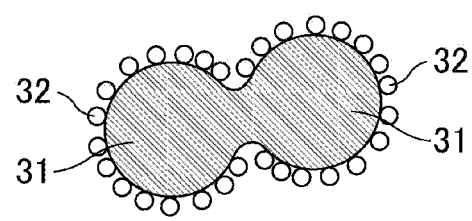

FIGS. 3A and 3B are schematic diagrams explaining the sintering of particles of an electrically conductive metal.

Covering the surface of particles of an electrically conductive metal 31 with an anti-sintering ceramic 32 as in the first electrically conductive powder 30 illustrated in FIG. 3A will limit necking between the particles of the electrically conductive metal 31 during the process of firing. During the process of firing, however, the anti-sintering ceramic 32 seems to aggregate on the surface of the particles of the electrically conductive metal 31, making the electrically conductive metal 31 exposed. Then as illustrated in FIG. 3B, the exposed portion of the electrically conductive metal 31 seems to serve as the starting point for necking between the particles of the electrically conductive metal 31, resulting in sintering. In the portion covered with the anti-sintering ceramic 32, however, the particles of the electrically conductive metal 31 do not sinter. As a result, the inventors believe, porous segments occur between boundaries in the electrically conductive metal 31.

In the method according to the present disclosure for producing a ceramic substrate, therefore, projecting electrodes are formed with limited contraction upon sintering, but the resulting projecting electrodes have a porous structure resulting from necking between particles of electrically conductive metal(s). By virtue of this, the projecting electrodes are free from cracks and other structural defects.

Moreover, the use of a first electrically conductive paste containing a first electrically conductive powder composed of particles of electrically conductive metal(s) and anti-sintering ceramic(s) covering the surface thereof helps reduce the amount of anti-sintering ceramic(s) compared with that with a known electrically conductive paste, which contains an electrically conductive powder composed of a powder of electrically conductive metal(s) and a powder of anti-sintering ceramic(s) added thereto. In this method, therefore, projecting electrodes free from cracks and other structural defects can be formed without necessarily increasing specific resistance.

In the method according to the present disclosure for producing a ceramic substrate, the electrically conductive metal contained in the first electrically conductive paste can be any such metal(s). However, examples include metals such as copper, silver, nickel, palladium, and their alloys. The electrically conductive metal can include at least one selected from the group consisting of copper, silver, and nickel, or can include one selected from the group consisting of copper, silver, and nickel. The electrically conductive metal can be one selected from the group consisting of copper, silver, and nickel.

The anti-sintering ceramic contained in the first electrically conductive paste can be any ceramic(s) capable of controlling the sintering of particles of the electrically conductive metal, but examples include metal oxides, such as alumina, zirconia, and silica. The anti-sintering ceramic can include at least one selected from the group consisting of alumina, zirconia, and silica, or can include one selected from the group consisting of alumina, zirconia, and silica. The anti-sintering ceramic can be one selected from the group consisting of alumina, zirconia, and silica.

The amount of the anti-sintering ceramic in the first electrically conductive paste to ensure low specific resistance of the projecting electrodes can be 10% by weight or less of the total weight of the electrically conductive metal and the anti-sintering ceramic. To ensure that the projecting electrodes will be free from structural defects, it can be 0.3% by weight or more of the total weight of the electrically conductive metal and the anti-sintering ceramic.

If a second electrically conductive paste, which is for forming dense layer(s), is applied to the surface of the through holes of an electrode formation sheet, the second electrically conductive powder, which is contained in the second electrically conductive paste, can contain at least one electrically conductive metal and at least one anti-sintering ceramic with at least part of the surface of particles of the electrically conductive metal covered with the anti-sintering ceramic, like the first electrically conductive powder.

The electrically conductive metal contained in the second electrically conductive paste can be any such metal(s), but examples include metals such as copper, silver, nickel, palladium, and their alloys. The electrically conductive metal contained in the second electrically conductive paste may be different from that or those in the first electrically conductive paste, but can be the same as that or those in the first electrically conductive paste.

The anti-sintering ceramic contained in the second electrically conductive paste can be any such ceramic(s), but examples include metal oxides, such as alumina, zirconia, and silica. The anti-sintering ceramic contained in the second electrically conductive paste may be different from that or those in the first electrically conductive paste, but can be the same as that or those in the first electrically conductive paste.

The amount of the anti-sintering ceramic in the second electrically conductive paste to ensure that the projecting electrodes will be dense can be 10% by weight or less of the total weight of the electrically conductive metal and the anti-sintering ceramic and can be 0.5% by weight or more of the total weight of the electrically conductive metal and the anti-sintering ceramic.

The following describes specific examples of what the electrode formation sheets can be.

The electrode formation sheets can be, for example, constraining sheets that undergo no sintering at the temperatures at which the ceramic green sheets sinter. In this case, firing the composite multilayer body and then removing the leftover constraining sheets will give a ceramic substrate having projecting electrodes.

The constraining sheets contain an inorganic material that undergoes no sintering at the temperatures at which the ceramic green sheets sinter. Specifically, the constraining sheets are sheets, for example shaped by doctor blading, of a slurry that contains such an inorganic material, e.g., an alumina powder, and an organic binder and a solvent. The slurry may contain additives, such as a dispersant and a plasticizer.

Figure 4A:
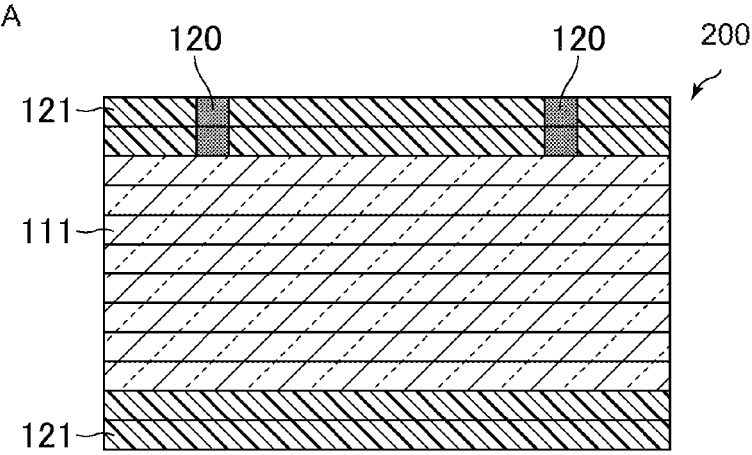
FIGS. 4A, 4B, and 4C are cross-sectional diagrams schematically illustrating an example of a method for producing a ceramic substrate in which constraining sheets are used.
Figure 4B:
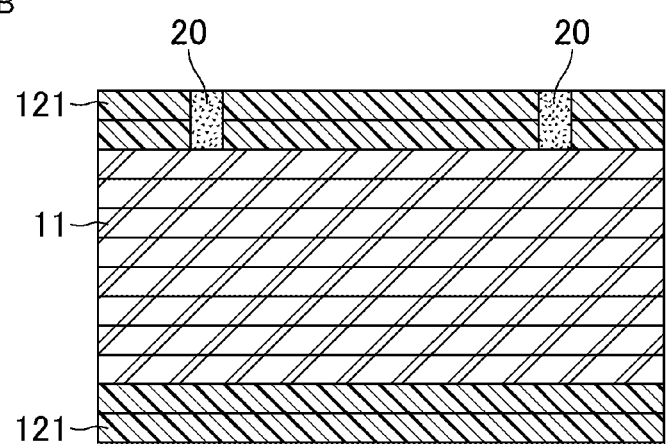
Figure 4C:
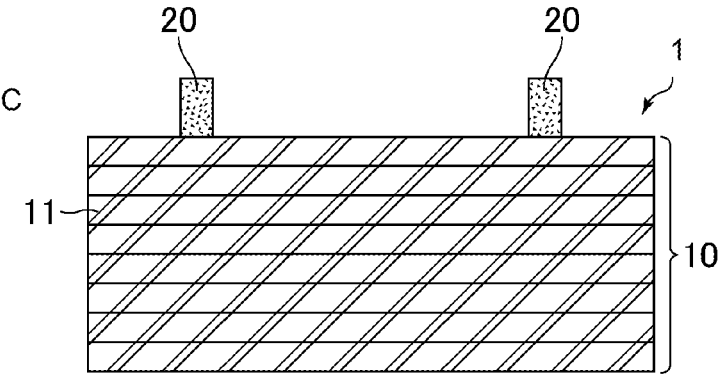

FIGS. 4A, 4B, and 4C are cross-sectional diagrams schematically illustrating an example of a method for producing a ceramic substrate in which constraining sheets are used.

As illustrated in FIG. 4A, a composite multilayer body 200 is built by stacking ceramic green sheets 111 and then stacking constraining sheets 121 having through holes filled with a first electrically conductive paste 120 on a first primary surface of the stack of ceramic green sheets 111.

The composite multilayer body 200 illustrated in FIG. 4A also has a stack of constraining sheets 121 on the second primary surface of the stack of ceramic green sheets 111, but this stack of constraining sheets 121 on the second primary surface is optional.

The composite multilayer body 200 is fired at a temperature at which the ceramic green sheets 111 sinter and the constraining sheets 121 do not. As a result of this, the ceramic green sheets 111 turn into ceramic layers 11, and the first electrically conductive paste 120 filling the through holes turns into projecting electrodes 20 as illustrated in FIG. 4B.

The constraining sheets 121 undergo no sintering and therefore do not contract upon firing. They rather work to limit the contraction of the stack of ceramic green sheets 111 in the direction along its primary surfaces, thereby helping improve the dimensional accuracy of the ceramic substrate.

After the firing of the composite multilayer body 200, the leftover constraining sheets 121 are removed. The removal of the constraining sheets can be done by, for example, wet blasting, sandblasting, or brushing.

This gives a ceramic substrate 1 that includes a substrate body 10 having ceramic layers 11 and projecting electrodes 20 on a first primary surface of the substrate body 10 as illustrated in FIG. 4C.

Figure 5A:
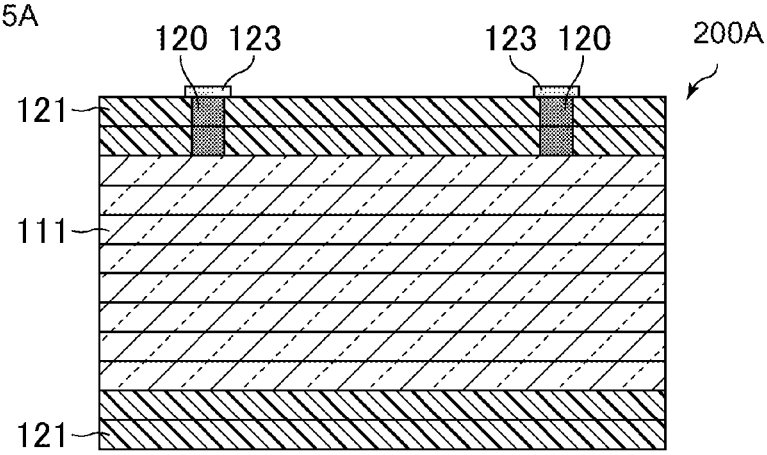
FIGS. 5A, 5B, and 5C are cross-sectional diagrams schematically illustrating another example of a method for producing a ceramic substrate in which constraining sheets are used.
Figure 5B:
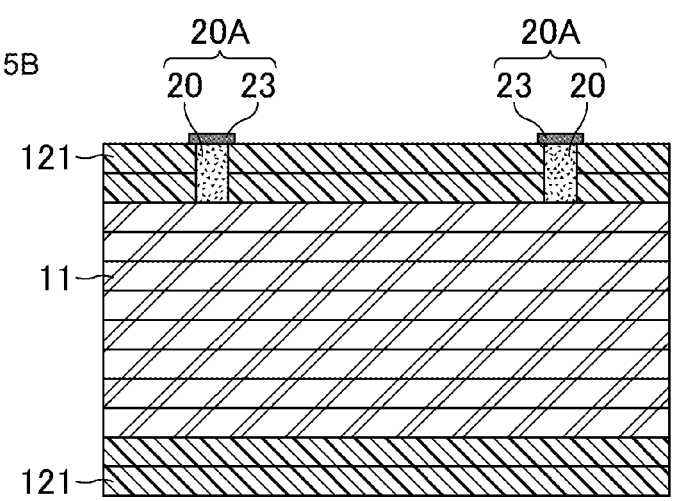
Figure 5C:
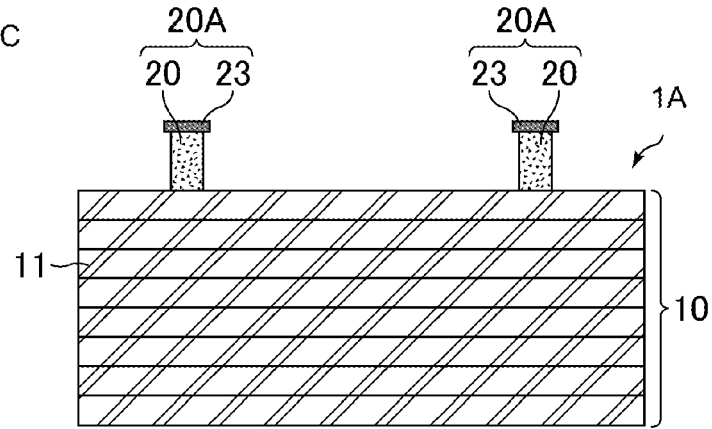

FIGS. 5A, 5B, and 5C are cross-sectional diagrams schematically illustrating another example of a method for producing a ceramic substrate in which constraining sheets are used.

In FIG. 5A, a composite multilayer body 200A is built with a top constraining sheet 121 that has an applied layer of a second electrically conductive paste 123 on the surface of the through holes. The rest is the same as the composite multilayer body 200 illustrated in FIG. 4A.

The composite multilayer body 200A is fired at a temperature at which the ceramic green sheets 111 sinter and the constraining sheets 121 do not. As a result of this, the ceramic green sheets 111 turn into ceramic layers 11, and the first electrically conductive paste 120 filling the through holes and the film of the second electrically conductive paste 123 form projecting electrodes 20A as illustrated in FIG. 5B. The portions with the applied second electrically conductive paste 123 turn into dense layers 23, layers having a lower porosity than the portions that had been filled with the first electrically conductive paste 120.

After the firing of the composite multilayer body 200A, the leftover constraining sheets 121 are removed.

This gives a ceramic substrate 1A that includes a substrate body 10 having ceramic layers 11 and projecting electrodes 20A on a first primary surface of the substrate body 10 as illustrated in FIG. 5C.

Figure 6A:
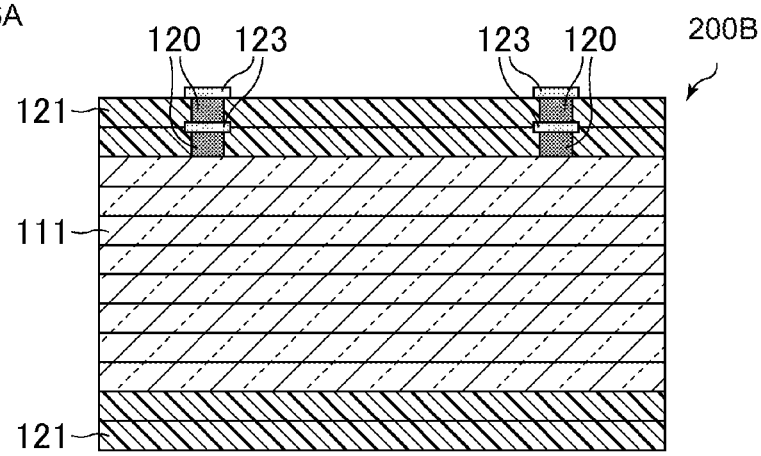
FIGS. 6A, 6B, and 6C are cross-sectional diagrams schematically illustrating yet another example of a method for producing a ceramic substrate in which constraining sheets are used.
Figure 6B:
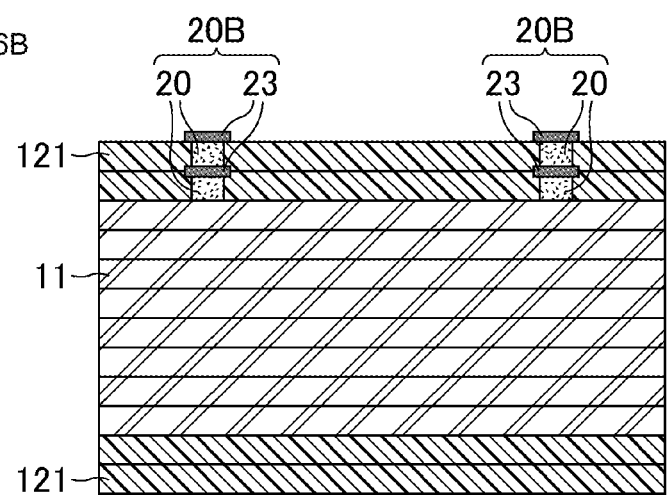
Figure 6C:
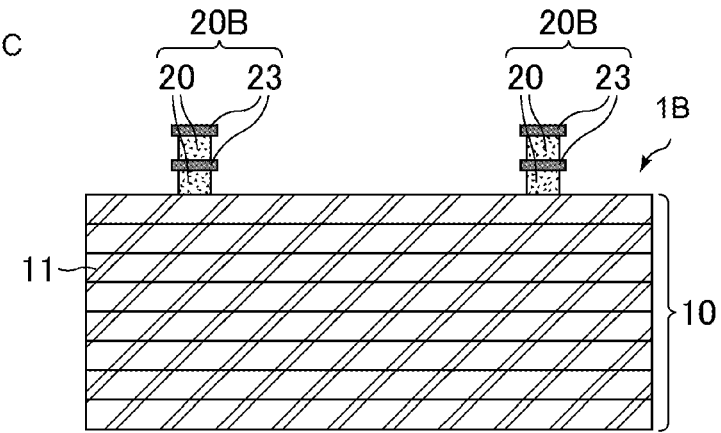

FIGS. 6A, 6B, and 6C are cross-sectional diagrams schematically illustrating yet another example of a method for producing a ceramic substrate in which constraining sheets are used.

In FIG. 6A, a composite multilayer body 200B is built with top and inner constraining sheets 121 that have an applied layer of a second electrically conductive paste 123 on the surface of the through holes. The rest is the same as the composite multilayer body 200A illustrated in FIG. 5A.

The composite multilayer body 200B is fired at a temperature at which the ceramic green sheets 111 sinter and the constraining sheets 121 do not. As a result of this, the ceramic green sheets 111 turn into ceramic layers 11, and the first electrically conductive paste 120 filling the through holes and the second electrically conductive paste 123 form projecting electrodes 20B as illustrated in FIG. 6B. In the same way as in FIG. 5B, the portions with the applied second electrically conductive paste 123 turn into dense layers 23, layers having a lower porosity than the portions that had been filled with the first electrically conductive paste 120.

After the firing of the composite multilayer body 200B, the leftover constraining sheets 121 are removed.

This gives a ceramic substrate 1B that includes a substrate body 10 having ceramic layers 11 and projecting electrodes 20B on a first primary surface of the substrate body 10 as illustrated in FIG. 6C.

If the constraining sheets are removed by, for example, blasting, low blasting pressure can cause constraining sheet residue to remain, although the projecting electrodes will not crack. High blasting pressure tends to cause the surface of the projecting electrodes to crack, although no constraining sheet residue will remain. Forming a dense layer atop of and/or inside the projecting electrodes helps prevent cracks and other defects in the projecting electrodes even if the blasting pressure is increased to ensure there will be no constraining sheet residue.

The electrode formation sheets may alternatively be, for example, resin sheets that burn away at or below the temperatures at which the ceramic green sheet sinter. In this case, burning away the resin sheets in the step of firing the composite multilayer body will give a ceramic substrate having projecting electrodes.

The resin sheets contain a resin material that burns away at or below the temperatures at which the ceramic green sheets sinter. Examples of resin materials for the resin sheets include acrylic resins and polypropylene resins.

Figure 7A:
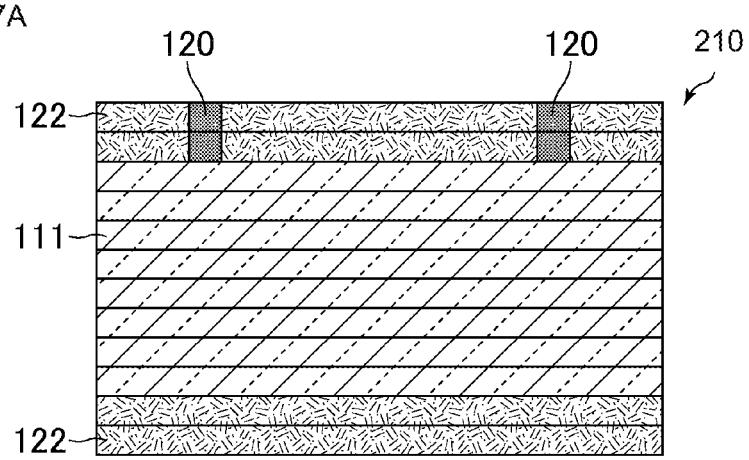
FIGS. 7A and 7B are cross-sectional diagrams schematically illustrating an example of a method for producing a ceramic substrate in which resin sheets are used.
Figure 7B:
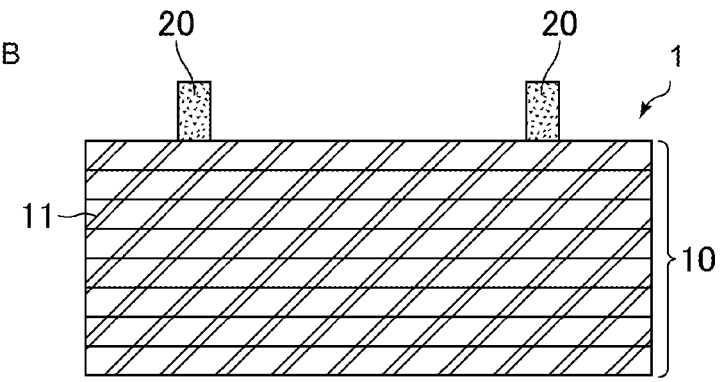

FIGS. 7A and 7B are cross-sectional diagrams schematically illustrating an example of a method for producing a ceramic substrate in which resin sheets are used.

As illustrated in FIG. 7A, a composite multilayer body 210 is built by stacking ceramic green sheets 111 and then stacking resin sheets 122 having through holes filled with a first electrically conductive paste 120 on a first primary surface of the stack of ceramic green sheets 111.

The composite multilayer body 210 illustrated in FIG. 7A also has a stack of resin sheets 122 on the second primary surface of a stack of ceramic green sheets 111, but this stack of resin sheets 122 on the second primary surface is optional. There may be a stack of constraining sheets 121, instead of resin sheets 122, on the second primary surface of the stack of ceramic green sheets 111. Likewise, there may be constraining sheets 121 outside the resin sheets 122 on the first or second primary surface of the stack of ceramic green sheets 111.

The composite multilayer body 210 is fired at a temperature at which the ceramic green sheets 111 sinter. As a result of this, the ceramic green sheets 111 turn into ceramic layers 11, and the first electrically conductive paste 120 filling the through holes turns into projecting electrodes 20 as illustrated in FIG. 7B.

The resin sheets 122 burn away, giving a ceramic substrate 1 that includes a substrate body 10 having ceramic layers 11 and projecting electrodes 20 on a first primary surface of the substrate body 10.

Even if the electrode formation sheets are resin sheets, the composite multilayer body may be built with a top resin sheet that has an applied layer of a second electrically conductive paste on the surface of the through holes like that made with constraining sheets. Likewise, the composite multilayer body may be built with top and inner resin sheets that have an applied layer of a second electrically conductive paste on the surface of the through holes.

[Module]

The ceramic substrate according to the present disclosure can be packaged into a module by mounting an electronic component, such as an IC chip, on the first primary surface of the substrate body and sealing it with a resin layer. Such a module is also an aspect of the present disclosure.

Figure 8A:
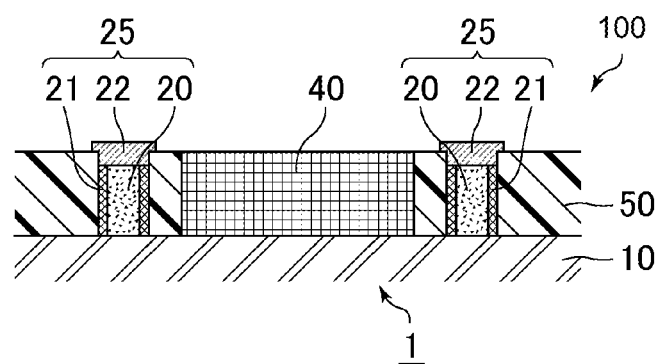
FIG. 8A is a schematic cross-section of an example of a module according to the present disclosure.
Figure 8B:
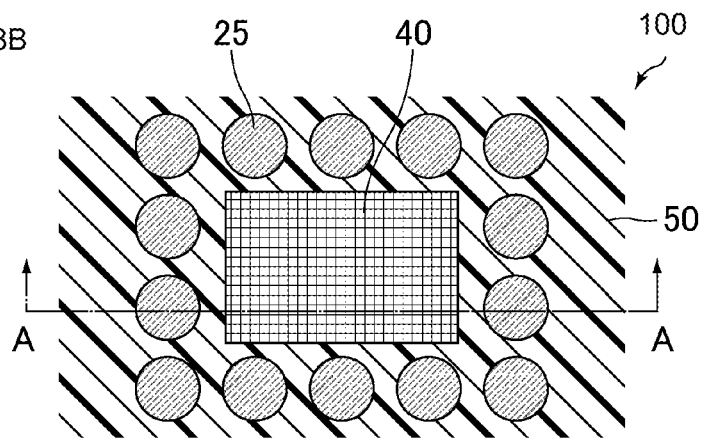
FIG. 8B is a plan view of the module illustrated in FIG. 8A.

FIG. 8A is a schematic cross-section of an example of a module according to the present disclosure, and FIG. 8B is a plan view of the module illustrated in FIG. 8A. FIG. 8A is a cross-section of line A-A of the module illustrated in FIG. 8B.

The module 100 illustrated in FIG. 8A includes a ceramic substrate 1, an electronic component 40 mounted on a first primary surface of a substrate body 10 as a component of the ceramic substrate 1, and a resin layer 50 on the first primary surface of the substrate body 10. The ceramic substrate 1 includes, as illustrated in FIG. 1, a substrate body 10 and columnar projecting electrodes 20 on a first primary surface of the substrate body 10.

The electronic component 40 is positioned in the resin layer 50 to be mounted in the area of the first primary surface of the substrate body 10 not occupied by the projecting electrodes 20.

On the first primary surface of the substrate body 10 are terminals for external connection 25 including the projecting electrodes 20, and the terminals for external connection 25 are positioned in the resin layer 50 to have the end thereof exposed on the surface of the resin layer 50. The terminals for external connection 25 are for connecting the module 100 to an external device, such as a motherboard, and have a connecting element (not illustrated), such as a solder bump, at their end.

In the module 100 illustrated in FIG. 8A, a terminal for external connection 25 includes, besides a projecting electrode 20, plating 21 that covers the side of the projecting electrode 20 and a coating 22 that covers the top of the projecting electrode 20. As illustrated in FIG. 8B, multiple terminals for external connection 25 surround the electronic component 40.

A module according to the present disclosure includes a ceramic substrate according to the present disclosure as described above. That is, in the module according to the present disclosure, the ceramic substrate includes a substrate body having ceramic layers and columnar projecting electrodes on a first primary surface of the substrate body. The projecting electrodes contain at least one electrically conductive metal and at least one anti-sintering ceramic that controls the sintering of particles of the electrically conductive metal, with at least part of the surface of the particles of the electrically conductive metal covered with the anti-sintering ceramic. The details of the structure of the ceramic substrate, including the projecting electrodes, are as described in

[Ceramic Substrate]

The module according to the present disclosure has, on the first primary surface of the substrate body, terminals for external connection including the projecting electrodes, and the terminals for external connection are positioned in a resin layer to have their end exposed on the surface of the resin layer. The end of the terminals for external connection can be sticking above the surface of the resin layer.

In the module according to the present disclosure, the terminals for external connection can further include plating that covers at least part of the side of the projecting electrodes. One end of the plating can be flush with one end of the projecting electrodes.

Plating that covers the side of the projecting electrodes improves the adhesion between the terminals for external connection and the resin layer. Detachment at the interfaces between the terminals for external connection and the resin layer will therefore be less likely even if, for example, the module is heated.

In the module according to the present disclosure, the terminals for external connection can further include a coating that covers at least part of the top of the projecting electrodes. The projecting electrodes can be recessed below the surface of the resin layer, and the coating can be sticking above the surface of the resin layer. The coating is formed by, for example, plating, sputtering, or deposition.

A coating covering the top of the projecting electrodes relaxes the stress that acts on the interfaces between the connection element, such as solder bumps, and the terminals for external connection. Such a coating therefore ensures more reliable connection between the module and an electronic device, such as a motherboard.

It should be noted that the surface of a projecting electrode facing the substrate body is herein referred to as "the bottom of the projecting electrode," and the surface of a projecting electrode opposite the bottom as "the top of the projecting electrode."

In the module according to the present disclosure, the electronic component is positioned in the resin layer to be mounted in the area of the first primary surface of the substrate body as a component of the ceramic substrate not occupied by the projecting electrodes. The electronic component can be, for example, an IC or an electronic component like a circuit module smaller than the module according to the present disclosure.

In the module according to the present disclosure, at least part of the surface of the electronic component can be exposed on the surface of the resin layer. The surface of the electronic component can be flush with the surface of the resin layer.

In the module according to the present disclosure, the electronic component can be entirely embedded in the resin layer and then ground from the side opposite the surface facing the substrate body. If the electronic component is, for example, an IC, this eliminates the need for using a thin and therefore difficult-to-handle IC in making the module low-profile.

In the module according to the present disclosure, the resin layer is a layer of, for example, resin material with dispersed filler, such as a glass material or silica, therein. The resin layer may alternatively be a layer of resin material alone.

A module according to the present disclosure can be produced as follows.

The method for producing a module according to the present disclosure includes a step of producing a ceramic substrate by a method according to the present disclosure for producing a ceramic substrate, a step of mounting an electronic component on the first primary surface of the substrate body as a component of the ceramic substrate, and a step of providing a resin layer on the first primary surface of the substrate body. The electronic component is mounted in the area of the first primary surface of the substrate body not occupied by the projecting electrodes. On the first primary surface of the substrate body are terminals for external connection including the projecting electrodes. In the step of providing a resin layer, the electronic component is placed in the resin layer, and the terminals for external connection are positioned in the resin layer to have the end thereof exposed on the surface of the resin layer.

In the method for producing a module according to the present disclosure, the resin layer can be provided after plating is formed to cover at least part of the side of the projecting electrodes. The resin layer can be provided after plating is formed to cover the side and top of the projecting electrodes.

In the method for producing a module according to the present disclosure, a coating can be formed to cover at least part of the top of the projecting electrodes with the top exposed on the surface of the resin layer. A coating can be formed to cover at least part of the top of the projecting electrodes with the top recessed below the surface of the resin layer.

In the method for producing a module according to the present disclosure, at least part of the surface of the electronic component can be made exposed on the surface of the resin layer by providing the resin layer to make the entire electronic component embedded therein and then grinding the electronic component and the resin layer from the side opposite the surface facing the substrate body.

FIGS. 9A, 9B, 9C, 9D, and 9E are cross-sectional diagrams schematically illustrating an example of a method for producing the module illustrated in FIG. 8A.

In FIG. 9A, an electronic component 40 is mounted on the first primary surface of the substrate body 10 as a component of a ceramic substrate 1.

The ceramic substrate 1 is produced as described in [Ceramic Substrate]. In FIG. 9A, plating 21 formed after the production of the ceramic substrate 1 is covering the outer surface of the projecting electrodes 20. The plating 21 can be formed by, for example, electroless plating. The electronic component 40 is mounted in the area of the first primary surface of the substrate body 10 not occupied by the projecting electrodes 20 covered with plating 21.

In FIG. 9B, a resin layer 50 is provided on the first primary surface of the substrate body 10 to make the entire electronic component 40 and the entire projecting electrodes 20 covered with plating 21 embedded therein.

For example, applying the resin material for forming the resin layer 50 to the first primary surface of the substrate body 10 will make the electronic component 40 and the projecting electrodes 20 covered with plating 21 embedded in the resin layer 50.

In FIG. 9C, the electronic component 40 and the resin layer 50 are ground from the side opposite the surface facing the substrate body 10.

This can be done to make the electronic component 40 thinner than before its mounting on the substrate body 10 and to make the ground surface of the electronic component 40, that of the resin layer 50, and that of the projecting electrodes 20 covered with plating 21 flush with each other. The grinding can be performed by, for example, lapping.

In FIG. 9D, the ground surface of the projecting electrodes 20 covered with plating 21 is etched to make the exposed top of the projecting electrodes 20 recessed below the surface of the resin layer 50.

In FIG. 9E, a coating 22 is formed to cover the top of the projecting electrodes 20 covered with plating 21. As a result of this, terminals 25 for external connection are formed. The formation of the coating 22 can be done by, for example, electroless plating.

In this way, the module 100 illustrated in FIG. 8A is obtained.

The ceramic substrate and module according to the present disclosure are not limited to the above embodiments. For example, the structure, conditions for production, etc., of the ceramic substrate have room for various modifications and many variations within the scope of the present disclosure.

EXAMPLES

The following are examples of more specific disclosures of the method according to the present disclosure for producing a ceramic substrate. It should be noted that the present disclosure is not limited to these examples.

Examples 1 to 20 and Comparative Examples 1 to 5

[Production of a Ceramic Substrate]
(1) Preparation of Ceramic Green Sheets

Ba-, Al-, and Si-based ceramic materials were prepared. The materials were blended to a predetermined composition, and the blend was calcined at 800° C. to 1000° C. The resulting calcined powder was pulverized in a zirconia ball mill for 12 hours, giving a ceramic powder.

This ceramic powder was mixed with organic solvents including toluene and EKINEN, and the resulting mixture was slurried by further mixing it with an organic binder and a plasticizer.

The resulting slurry was shaped into 50-μm thick ceramic green sheets by doctor blading.

(2) Preparation of Constraining Sheets

An alumina powder having particle diameters of 0.5 μm to 5.0 μm and an acrylic organic binder were slurried by mixing. The resulting slurry was shaped into 100-μm thick constraining sheets by doctor blading.

(3) Preparation of Electrically Conductive Pastes for Projecting Electrodes

Electrically conductive powders, an organic binder, and optionally an additive were mixed to the proportions specified in Table 1 and dispersed using a three-roll mill, giving electrically conductive pastes L1 to L25 for projecting electrodes.

The average particle diameter (D50) of the electrically conductive powders listed in Table 1 is 3 μm for all. In Table 1, "0.2 wt % alumina-coated copper," for example, represents an electrically conductive powder composed of particles of copper and a coating of alumina on their surface, with the percentage of alumina to the total weight of copper and alumina being 0.2% by weight.

TABLE 1

| Paste name | Electrically conductive powder | | Additive | | Organic binder | |
| --- | --- | --- | --- | --- | --- | --- |
| | Type | (vol %) | Type | (vol %) | Type | (vol %) |
| L 1 | 0.2 wt % alumina-coated copper | 60 | None | — | Ethyl cellulose/ terpineol binder | 40 |
| L 2 | 0.2 wt % alumina-coated copper | 50 | None | — | | 50 |
| L 3 | 0.2 wt % alumina-coated copper | 40 | None | — | | 60 |
| L 4 | 0.3 wt % alumina-coated copper | 60 | None | — | | 40 |
| L 5 | 0.3 wt % alumina-coated copper | 50 | None | — | | 50 |
| L 6 | 0.3 wt % alumina-coated copper | 40 | None | — | | 60 |
| L 7 | 0.5 wt % alumina-coated copper | 60 | None | — | | 40 |
| L 8 | 0.5 wt % alumina-coated copper | 50 | None | — | | 50 |
| L 9 | 0.5 wt % alumina-coated copper | 40 | None | — | | 60 |

TABLE 1-continued

| Paste name | Electrically conductive powder Type | (vol %) | Additive Type | (vol %) | Organic binder Type | (vol %) |
|---|---|---|---|---|---|---|
| L 10 | 5 wt % alumina-coated copper | 60 | None | — | | 40 |
| L 11 | 5 wt % alumina-coated copper | 50 | None | — | | 50 |
| L 12 | 5 wt % alumina-coated copper | 40 | None | — | | 60 |
| L 13 | 10 wt % alumina-coated copper | 50 | None | — | | 50 |
| L 14 | 15 wt % alumina-coated copper | 50 | None | — | | 50 |
| L 15 | 0.3 wt % zirconia-coated copper | 50 | None | — | | 50 |
| L 16 | 3 wt % zirconia-coated copper | 50 | None | — | | 50 |
| L 17 | 10 wt % zirconia-coated copper | 50 | None | — | | 50 |
| L 18 | 0.3 wt % silica-coated copper | 50 | None | — | | 50 |
| L 19 | 3 wt % silica-coated copper | 50 | None | — | | 50 |
| L 20 | 10 wt % silica-coated copper | 50 | None | — | | 50 |
| * L 21 | Copper | 50 | Alumina powder | 0.1 | | 49.9 |
| * L 22 | Copper | 50 | Alumina powder | 5 | | 45 |
| * L 23 | Copper | 50 | Alumina powder | 20 | | 30 |
| * L 24 | Copper | 50 | Alumina powder | 40 | | 10 |
| * L 25 | Copper | 50 | Alumina powder | 30 | | 20 |

In Table 1, electrically conductive pastes L21 to L25 are out of the scope of the present disclosure.

(4) Perforation with Through Holes and Filling with an Electrically Conductive Paste For each of the electrically conductive pastes, constraining sheets as described above were perforated with 200-μm diameter through holes by laser machining, and then the through holes were filled with the electrically conductive paste.

(5) Building of a Composite Multilayer Body

The ceramic green sheets were stacked, and two constraining sheets filled with the electrically conductive paste were stacked on both primary surfaces. The workpiece was pressed to bond the sheets together, giving a composite multilayer body as illustrated in FIG. 4A.

(6) Firing of the Composite Multilayer Body

The resulting composite multilayer body was fired, with the highest temperature set to an appropriate point between 980° C. and 1000° C., giving a fired workpiece as illustrated in FIG. 4B.

During the firing, the atmosphere in the furnace was controlled using N$_2$/H$_2$/H$_2$O to achieve an oxygen concentration at which copper would not become oxidized.

(7) Removal of the Constraining Sheets

The constraining sheets were removed by washing the fired workpiece with a washer fluid composed of alumina abrasive grains and water.

In this way, a ceramic substrate was obtained with projecting electrodes as illustrated in FIG. 4C.

[Characterization]

The ceramic substrates obtained were tested for cracking. In addition to this, the electrically conductive pastes, for forming the projecting electrodes, were subjected to the measurement of specific resistance.

(1) Testing for Cracking

Epoxy resin with an embedded ceramic substrate therein was cured. The cured resin was ground to expose a cross-section of the projecting electrodes, and the cross-section was visually inspected for cracks. The "Electrodes cracked" column in Table 2 indicates whether or not cracks were observed. In Table 2, "Possibly cracked" means projecting electrodes made with alumina-coated copper can crack if the percentage of alumina is very low, e.g., 0.2% by weight or less.

(2) Measurement of Specific Resistance

Figure 10:
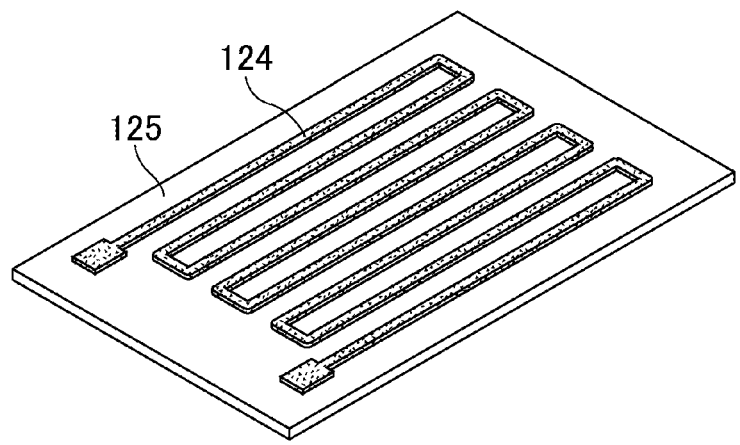
FIG. 10 is a schematic perspective view of a specimen for the measurement of specific resistance.

FIG. 10 is a schematic perspective view of a specimen for the measurement of specific resistance.

The electrically conductive paste 124 for forming the projecting electrodes was applied to an alumina substrate 125 as illustrated in FIG. 10. The alumina substrate with applied electrically conductive paste thereon was fired, with the highest temperature set to an appropriate point between 980° C. and 1000° C. The thickness and resistance of the fired film on the fired alumina substrate were measured, and the measurements were used to calculate specific resistance.

In the "Specific resistance" column in Table 2, electrically conductive paste was graded ⊙ (excellent) if its specific resistance was less than 3 μΩ·cm, ○ (good) if its specific resistance was 3 μΩ·cm or more and less than 5 μΩ·cm, Δ (acceptable) if its specific resistance was 5 μΩ·cm or more and less than 7 μΩ·cm, and x (poor) if its specific resistance was 7 μΩ·cm or more.

(3) Overall Rating

In Table 2, projecting electrodes that did not crack and achieved a specific resistance grade of "○" are good ones and labeled "○" in the Overall rating column. Projecting electrodes that did not crack and achieved a specific resistance grade of "⊙" are better ones and labeled "⊙" in the Overall rating column. Projecting electrodes that cracked or were graded "x" for specific resistance are poor ones and labeled "x" in the Overall rating column. Projecting electrodes that can crack or were graded "Δ" for specific resistance are labeled "Δ" in the Overall rating column.

TABLE 2

| | Paste name | Electrodes cracked | Specific resistance | Overall rating |
|---|---|---|---|---|
| Example 1 | L 1 | Possibly cracked | ⊙ | Δ |
| Example 2 | L 2 | Possibly cracked | ⊙ | Δ |
| Example 3 | L 3 | Possibly cracked | ⊙ | Δ |
| Example 4 | L 4 | No | ⊙ | ⊙ |
| Example 5 | L 5 | No | ⊙ | ⊙ |
| Example 6 | L 6 | No | ⊙ | ⊙ |
| Example 7 | L 7 | No | ⊙ | ⊙ |
| Example 8 | L 8 | No | ⊙ | ⊙ |
| Example 9 | L 9 | No | ⊙ | ⊙ |
| Example 10 | L 10 | No | ⊙ | ⊙ |
| Example 11 | L 11 | No | ⊙ | ⊙ |
| Example 12 | L 12 | No | ⊙ | ⊙ |
| Example 13 | L 13 | No | ○ | ○ |
| Example 14 | L 14 | No | Δ | Δ |

TABLE 2-continued

| | Paste name | Electrodes cracked | Specific resistance | Overall rating |
|---|---|---|---|---|
| Example 15 | L 15 | No | ⊙ | ⊙ |
| Example 16 | L 16 | No | ⊙ | ⊙ |
| Example 17 | L 17 | No | ○ | ○ |
| Example 18 | L 18 | No | ⊙ | ⊙ |
| Example 19 | L 19 | No | ⊙ | ⊙ |
| Example 20 | L 20 | No | ○ | ○ |
| Comparative Example 1 | L 21 | Yes | ⊙ | X |
| Comparative Example 2 | L 22 | Yes | ○ | X |
| Comparative Example 3 | L 23 | No | X | X |
| Comparative Example 4 | L 24 | No | X | X |
| Comparative Example 5 | L 25 | No | X | X |

In Examples 1 to 20, the projecting electrodes were made using electrically conductive pastes L1 to L20, each containing an electrically conductive powder composed of particles of copper as an electrically conductive metal and alumina, zirconia, or silica as an anti-sintering ceramic covering the surface of the particles. Tables 1 and 2 indicate that in these Examples, the projecting electrodes were free from cracks and had a low specific resistance.

In particular, the results for Examples 1 to 13 and 15 to 20 suggest that to reduce the specific resistance of the projecting electrodes, the amount of the anti-sintering ceramic in the electrically conductive paste can be 10% by weight or less of the total weight of the electrically conductive metal and the anti-sintering ceramic. The results for Examples 4 to 20, moreover, suggest that to prevent cracks, the amount of the anti-sintering ceramic in the electrically conductive paste can be 0.3% by weight or more of the total weight of the electrically conductive metal and the anti-sintering ceramic.

In Comparative Examples 1 to 5, the projecting electrode were made using electrically conductive pastes L21 to L25, each containing an electrically conductive powder that was a mixture of a powder of copper as an electrically conductive metal and a powder of alumina as an anti-sintering ceramic added thereto. Of these, Comparative Examples 1 and 2, in which the electrically conductive paste contained a small amount of anti-sintering ceramic, resulted in cracked projecting electrodes, and Comparative Examples 3 to 5, in which the electrically conductive paste contained a large amount of anti-sintering ceramic, resulted in a high specific resistance of the projecting electrodes.

Examples 21 to 29

[Production of a Ceramic Substrate]
(1) Preparation of Ceramic Green Sheets

Ceramic green sheets having a thickness of 30 μm were prepared in the same way as described above.

(2) Preparation of Constraining Sheets

Constraining sheets having a thickness of 100 μm were prepared in the same way as described above.

(3) Preparation of Electrically Conductive Pastes for Projecting Electrodes

Electrically conductive powders and an organic binder were mixed to the proportions specified in Table 3 and dispersed using a three-roll mill, giving electrically conductive pastes S1 to S3 for projecting electrodes. The average particle diameter (D50) of the electrically conductive powders listed in Table 3 is 3 μm for all.

TABLE 3

| Paste name | Electrically conductive powder | | Organic binder | |
|---|---|---|---|---|
| | Type | (vol %) | Type | (vol %) |
| S 1 | 0.5 wt % alumina-coated copper | 40 | Ethyl cellulose/ terpineol binder | 60 |
| S 2 | 3 wt % alumina-coated copper | 50 | | 50 |
| S 3 | 10 wt % alumina-coated copper | 60 | | 40 |

(4) Perforation with Through Holes, Filling with an Electrically Conductive Paste, and Application of an Electrically Conductive Paste For each of the electrically conductive pastes, constraining sheets as described above were perforated with 200-μm diameter through holes by laser machining, and then the through holes were filled with the electrically conductive paste as specified in Table 4. The electrically conductive paste was also applied to the surface of through holes filled with an electrically conductive paste as necessary.

(5) Building of a Composite Multilayer Body

The ceramic green sheets were stacked, and two constraining sheets filled with the electrically conductive paste were stacked on both primary surfaces. The workpiece was pressed to bond the sheets together, giving a composite multilayer body as illustrated in FIG. 4A (Examples 21 and 22), FIG. 5A (Examples 23 to 25 and 27 to 29), or FIG. 6A (Example 26).

(6) Firing of the Composite Multilayer Body

The resulting composite multilayer body was fired, with the highest temperature set to an appropriate point between 980° C. and 1000° C., giving a fired workpiece as illustrated in FIG. 4B, 5B, or 6B.

During the firing, the atmosphere in the furnace was controlled using $N_2/H_2/H_2O$ to achieve an oxygen concentration at which copper would not become oxidized.

(7) Removal of the Constraining Sheets

The constraining sheets were removed by wet blasting of the fired workpiece using a washer fluid composed of alumina abrasive grains and water. The blasting pressure was as in Table 4.

In this way, a ceramic substrate was obtained with projecting electrodes as illustrated in FIG. 4C, 5C, or 6C.

[Characterization]

The ceramic substrates obtained were tested for constraining sheet residue and cracks in the projecting electrodes. In addition to this, the electrically conductive pastes, for forming the projecting electrodes, were subjected to the measurement of specific resistance.

(1) Testing for Constraining Sheet Residue and Cracks in the Projecting Electrodes The ceramic substrates were inspected using a 10× stereo microscope for constraining sheet residue and cracks in the projecting electrodes. In Table 4, the result is x if any residue or crack was observed, and ○ if no residue or crack was observed.

(2) Measurement of Specific Resistance

The method for the measurement of specific resistance was the same as described above.

In the "Specific resistance" column in Table 4, electrically conductive paste was graded ○ (good) if its specific resistance was less than 7 μΩ·cm, and x (poor) if its specific resistance was 7 μΩ·cm or more.

(3) Overall Rating

In Table 4, ceramic substrates that achieved "○" in all tests are labeled "○" in the Overall rating column, ceramic substrates with "x" in one test are labeled "Δ" in the Overall rating column, and ceramic substrates with "x" in two or more tests are labeled "x" in the Overall rating column.

TABLE 4

|  | Dense layer (top) | Dense layer (inside) | Through holes | Blasting pressure (MPa) | Constraining sheet residue | Cracks | Specific resistance | Overall rating |
|---|---|---|---|---|---|---|---|---|
| Example 21 | — | — | S1 | 0.20 | X | ○ | ○ | Δ |
| Example 22 | — | — | S1 | 0.30 | ○ | X | ○ | Δ |
| Example 23 | S1 | — | S1 | 0.30 | ○ | ○ | ○ | ○ |
| Example 24 | S3 | — | S1 | 0.30 | ○ | ○ | ○ | ○ |
| Example 25 | S1 | — | S2 | 0.30 | ○ | ○ | ○ | ○ |
| Example 26 | S2 | S2 | S2 | 0.30 | ○ | ○ | ○ | ○ |
| Example 27 | S3 | — | S2 | 0.30 | ○ | ○ | ○ | ○ |
| Example 28 | S1 | — | S3 | 0.30 | ○ | ○ | ○ | ○ |
| Example 29 | S3 | — | S3 | 0.30 | ○ | ○ | ○ | ○ |

In Example 21, the projecting electrodes were not cracked, but there was constraining sheet residue on the substrate because of low blasting pressure. Constraining sheet residue can cause plated electrodes to be weak.

In Example 22, no constraining sheet residue was observed by virtue of high blasting pressure, but the projecting electrodes were cracked.

In Examples 23 to 29, the projecting electrodes themselves were not cracked, and a dense layer formed atop of and/or inside the projecting electrodes provided resistance to blasting. The projecting electrodes were therefore not cracked, with no increase in specific resistance.

REFERENCE SIGNS LIST 1, 1A, 1B Ceramic substrate
10 Substrate body
11 Ceramic layer
20, 20A, 20B Projecting electrode
20a Pore
21 Plating
22 Coating
23 Dense layer
25 Terminal for external connection
30 First electrically conductive powder
31 Electrically conductive metal
32 Anti-sintering ceramic
40 Electronic component
50 Resin layer
100 Module
111 Ceramic green sheet
120 First electrically conductive paste
121 Constraining sheet
122 Resin sheet
123 Second electrically conductive paste
124 Electrically conductive paste
125 Alumina substrate
200, 200A, 200B, 210 Composite multilayer body
$R_{40}$ Region for the mounting of an electronic component

The invention claimed is:

1. A method for producing a ceramic substrate that includes a substrate body having ceramic layers and columnar projecting electrodes on a first primary surface of the substrate body, the method comprising;
    a step of preparing ceramic green sheets as a precursor of the ceramic layers;
    a step of preparing electrode formation sheets for forming the projecting electrodes;
    a step of perforating the electrode formation sheets with through holes and filling the through holes with a first electrically conductive paste containing a first electrically conductive powder;
    a step of building a composite multilayer body by stacking the ceramic green sheets and stacking the electrode formation sheets with the through holes therein filled with the first electrically conductive paste on a first primary surface of the stack of ceramic green sheets; and
    a step of firing the composite multilayer body at a temperature at which the ceramic green sheets sinter, wherein
    the first electrically conductive powder contains at least one electrically conductive metal and at least one anti-sintering ceramic that controls sintering of particles of the electrically conductive metal, with at least part of a surface of the particles of the electrically conductive metal covered with the anti-sintering ceramic.

2. The method according to claim 1 for producing a ceramic substrate, wherein:
    the electrode formation sheets are constraining sheets that undergo no sintering at temperatures at which the ceramic green sheets sinter; and
    the composite multilayer body is fired at a temperature at which the ceramic green sheets sinter and the constraining sheets do not, and then the leftover constraining sheets are removed.

3. The method according to claim 1 for producing a ceramic substrate, wherein:
    the electrode formation sheets are resin sheets that burn away at or below temperatures at which the ceramic green sheets sinter; and
    in the step of firing the composite multilayer body, the resin sheets are burnt away.

4. The method according to claim 1 for producing a ceramic substrate, further comprising, after the step of filling the through holes with the first electrically conductive paste, a step of applying a second electrically conductive paste containing a second electrically conductive powder to a surface of the through holes, wherein:
    the second electrically conductive powder contains the electrically conductive metal and the anti-sintering ceramic, with at least part of a surface of particles of the electrically conductive metal covered with the anti-sintering ceramic; and
    in the step of building the composite multilayer body, the electrode formation sheet with the second electrically conductive paste applied to the surface of the through holes is placed atop.

5. The method according to claim 4 for producing a ceramic substrate, wherein in the step of building the composite multilayer body, the electrode formation sheet with the second electrically conductive paste applied to the surface of the through holes is placed inside the through holes.

6. The method according to claim 4 for producing a ceramic substrate, wherein an amount of the anti-sintering ceramic in the second electrically conductive paste is 10% by weight or less of a total weight of the electrically conductive metal and the anti-sintering ceramic.

7. The method according to claim 6 for producing a ceramic substrate, wherein the amount of the anti-sintering ceramic in the second electrically conductive paste is 0.5% by weight or more of the total weight of the electrically conductive metal and the anti-sintering ceramic.

8. A ceramic substrate comprising a substrate body having ceramic layers and columnar projecting electrodes on a first primary surface of the substrate body, wherein:
the first primary surface of the substrate body has a region for mounting an electronic component in an area not occupied by the projecting electrodes; and
the projecting electrodes contain at least one electrically conductive metal and at least one anti-sintering ceramic that controls sintering of particles of the electrically conductive metal, and have a porous structure resulting from necking between the particles of the electrically conductive metal.

9. The ceramic substrate according to claim 8, wherein the anti-sintering ceramic includes at least one selected from the group consisting of alumina, zirconia, and silica.

10. The ceramic substrate according to claim 8, wherein the electrically conductive metal includes at least one selected from the group consisting of copper, silver, and nickel.

11. The ceramic substrate according to claim 8, wherein an amount of the anti-sintering ceramic in the projecting electrodes is 10% by weight or less of a total weight of the electrically conductive metal and the anti-sintering ceramic.

12. The ceramic substrate according to claim 11, wherein the amount of the anti-sintering ceramic in the projecting electrodes is 0.3% by weight or more of the total weight of the electrically conductive metal and the anti-sintering ceramic.

13. The ceramic substrate according to claim 8, wherein at least part of a surface of the particles of the electrically conductive metal is covered with the anti-sintering ceramic.

14. The ceramic substrate according to claim 8, wherein the projecting electrodes have a dense layer having a lower porosity than a remaining portion of the electrodes atop each of the projecting electrodes.

15. The ceramic substrate according to claim 14, wherein the projecting electrodes have the dense layer inside of the projecting electrodes, respectively.

16. The ceramic substrate according to claim 14, wherein the dense layer of the projecting electrodes is wider than a portion excluding the dense layer.

17. A module comprising:
a ceramic substrate according to claim 8;
an electronic component mounted on the first primary surface of the substrate body as a component of the ceramic substrate; and
a resin layer on the first primary surface of the substrate body, wherein:
the electronic component is positioned in the resin layer to be mounted in an area of the first primary surface of the substrate body not occupied by the projecting electrodes;
on the first primary surface of the substrate body are terminals for external connection including the projecting electrodes; and
the terminals for external connection are positioned in the resin layer to have an end exposed on a surface of the resin layer.

18. The module according to claim 17, wherein at least part of a surface of the electronic component is exposed on the surface of the resin layer.

19. The module according to claim 17, wherein the terminals for external connection further include plating that covers at least part of a side of the projecting electrodes.

20. The module according to claim 17, wherein the terminals for external connection further include a coating that covers at least part of a top of the projecting electrodes.

* * * * *